(12) United States Patent
Koshi et al.

(10) Patent No.: US 9,666,430 B2
(45) Date of Patent: *May 30, 2017

(54) METHOD OF MANUFACTURING SEMICONDUCTOR DEVICE AND SUBSTRATE PROCESSING APPARATUS

(71) Applicant: HITACHI KOKUSAI ELECTRIC INC., Tokyo (JP)

(72) Inventors: Yasunobu Koshi, Hakusan (JP); Keigo Nishida, Kahoku-county (JP); Kiyohiko Maeda, Imizu (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/597,372

(22) Filed: Jan. 15, 2015

(65) Prior Publication Data

US 2015/0126021 A1     May 7, 2015

Related U.S. Application Data

(63) Continuation of application No. 13/758,334, filed on Feb. 4, 2013, which is a continuation of application No. PCT/JP2011/069319, filed on Aug. 26, 2011.

(30) Foreign Application Priority Data

Sep. 1, 2010  (JP) ................. 2010-195662

(51) Int. Cl.
*H01L 21/20*     (2006.01)
*H01L 21/02*     (2006.01)
(Continued)

(52) U.S. Cl.
CPC .... *H01L 21/02592* (2013.01); *C23C 16/0236* (2013.01); *C23C 16/24* (2013.01);
(Continued)

(58) Field of Classification Search
CPC .......... H01L 21/0259; H01L 21/02211; H01L 21/0234; H01L 21/02532; H01L 21/0262;
(Continued)

(56) References Cited

U.S. PATENT DOCUMENTS 7,816,236 B2 *  10/2010  Bauer ................... C23C 16/04
                                                           438/478
8,802,547 B2     8/2014  Kakimoto et al.
(Continued)

FOREIGN PATENT DOCUMENTS

JP    H05-267166 A    10/1993
JP    H07-249600 A     9/1995
(Continued)

OTHER PUBLICATIONS

Sep. 20, 2011 Search Report issued in International Application No. PCT/JP2011/069319.
(Continued)

*Primary Examiner* — Eric Ward
*Assistant Examiner* — Eric Ashbahian
(74) *Attorney, Agent, or Firm* — Oliff PLC

(57) ABSTRACT

A film is formed on a substrate by performing a cycle at least twice, the cycle including a nucleus formation process for forming nuclei on the substrate and a nucleus growth suppression process for suppressing growth of the nuclei. A time required for the nucleus growth suppression process is less than or equal to a time required for the nucleus formation process. Alternatively, the nucleus formation process is further performed after the cycle is repeatedly performed a plurality of times.

13 Claims, 5 Drawing Sheets

(51) Int. Cl.
*C23C 16/02* (2006.01)
*C23C 16/24* (2006.01)
*C23C 16/455* (2006.01)
*C23C 16/52* (2006.01)

(52) U.S. Cl.
CPC .. *C23C 16/45523* (2013.01); *C23C 16/45544* (2013.01); *C23C 16/52* (2013.01); *H01L 21/0245* (2013.01); *H01L 21/0262* (2013.01); *H01L 21/02532* (2013.01)

(58) Field of Classification Search
CPC . H01L 21/0245; C23C 16/0236; C23C 16/24; C23C 16/45523; C23C 16/45544
USPC .......................................................... 438/478
See application file for complete search history.

(56) References Cited

U.S. PATENT DOCUMENTS

| | | | |
|---|---|---|---|
| 2002/0022347 A1* | 2/2002 | Park | H01L 21/02381 438/478 |
| 2003/0113971 A1* | 6/2003 | Nagaoka | H01L 21/28525 438/287 |
| 2006/0166414 A1 | 7/2006 | Carlson et al. | |
| 2007/0298594 A1* | 12/2007 | Mizushima | H01L 21/02381 438/479 |
| 2008/0242064 A1 | 10/2008 | Inokuchi et al. | |
| 2009/0104740 A1 | 4/2009 | Inokuchi et al. | |
| 2010/0062585 A1* | 3/2010 | Takahashi | C23C 16/0245 438/479 |
| 2010/0062586 A1* | 3/2010 | Ohnuma | H01L 21/02422 438/479 |
| 2010/0136767 A1* | 6/2010 | Hwang | C23C 16/0272 438/468 |
| 2011/0053358 A1* | 3/2011 | Toriumi | C23C 16/24 438/488 |

FOREIGN PATENT DOCUMENTS

| | | |
|---|---|---|
| JP | 2005-183514 A | 7/2005 |
| WO | 2007-013464 A1 | 2/2007 |

OTHER PUBLICATIONS

Sep. 20, 2011 Written Opinion issued in International Application No. PCT/JP2011/069319.
Mar. 12, 2013 International Preliminary Report on Patentability issued in International Application No. PCT/JP2011/069319.
Jul. 5, 2013 Office Action issued in Japanese Application No. 2012-531844.
Mar. 31, 2016 Office Action Issued in U.S. Appl. No. 13/758,334.
Dec. 6, 2016 Office Action Issued in U.S. Appl. No. 13/758,334.
Sep. 30, 2015 Office Action Issued in U.S. Appl. No. 13/758,334.

* cited by examiner

US 9,666,430 B2

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2010-195662 filed on Sep. 1, 2010 in the Japanese Patent Office, and International Patent Application No. PCT/JP2011/069319 filed on Aug. 26, 2011 in the WIPO, and is a continuation of U.S. non-provisional patent application Ser. No. 13/758,334 filed on Feb. 4, 2013, the entire contents of which are hereby incorporated by reference.

BACKGROUND OF THE INVENTION

1. Field of the Invention

The present invention relates to a method of manufacturing a semiconductor device including a substrate processing process, and a substrate processing apparatus, and more particularly, to a method of manufacturing a semiconductor device including forming a silicon film and a substrate processing apparatus.

2. Description of the Related Art

In one process of a manufacturing process of a semiconductor device, a NAND flash memory developed after 2X-nm NAND flash memory has been suggested to be applied to a terabit cell array transistor (TCAT) using either a floating gate (FG) structure including a silicon film or the silicon film as a channel of a longitudinal transistor and to bit-cost scalable (BICS) technology so as to prevent interference from occurring between adjacent cells and reduce bit costs.

However, when the silicon film is used in this case, the roughness (Rms) of the silicon film may be degraded, thereby preventing high carrier mobility from being achieved. Also, when the silicon film is used as a part of a semiconductor device, the performance of the semiconductor device may not be sufficiently exhibited, thereby lowering the throughput.

On the other hand, Japanese Patent Application Laid-Open No. H7-249600 discloses that after a silicon film is formed, a surface of the silicon film is polished using an abrasive to planarize the surface of the silicon film.

SUMMARY OF THE INVENTION

However, pollutants or particles may be generated during polishing of a surface of a silicon film and may then be mixed with a substrate including the silicon film. In this case, the quality of the substrate or the performance of a semiconductor device may be degraded.

It is an object of the present invention to provide a method of manufacturing a semiconductor device, which is capable of preventing the quality of a substrate or the performance of the semiconductor device from being degraded, and a substrate processing apparatus.

According to one aspect of the present invention, there is provided a method of manufacturing a semiconductor device, comprising: (a) forming silicon nuclei on a substrate by alternately performing: (a-1) supplying a first silicon-containing gas containing chlorine to the substrate; and (a-2) supplying a second silicon-containing gas different from the first silicon-containing gas to the substrate; and (b) supplying a third silicon-containing gas different from the first silicon-containing gas to the substrate to grow the silicon nuclei into a silicon film.

According to another aspect of the present invention, there is provided a substrate processing apparatus comprising: a process chamber configured to accommodate a substrate; a first gas supply system configured to supply a first silicon-containing gas containing chlorine to the substrate in the process chamber; a second gas supply system configured to supply a second silicon-containing gas different from the first silicon-containing gas to the substrate in the process chamber; a third gas supply system configured to supply a third silicon-containing gas different from the first silicon-containing gas to the substrate in the process chamber; a controller configured to control the first gas supply system, the second gas supply system and the third supply system to perform: (a) forming silicon nuclei on the substrate by alternately performing: (a-1) supplying the first silicon-containing gas to the substrate in the process chamber; and (a-2) supplying the second silicon-containing gas to the substrate in the process chamber; and (b) supplying the third silicon-containing gas to the substrate in the process chamber to grow the silicon nuclei into a silicon film.

DETAILED DESCRIPTION OF THE PREFERRED EMBODIMENTS

<First Embodiment>

Figure 1:
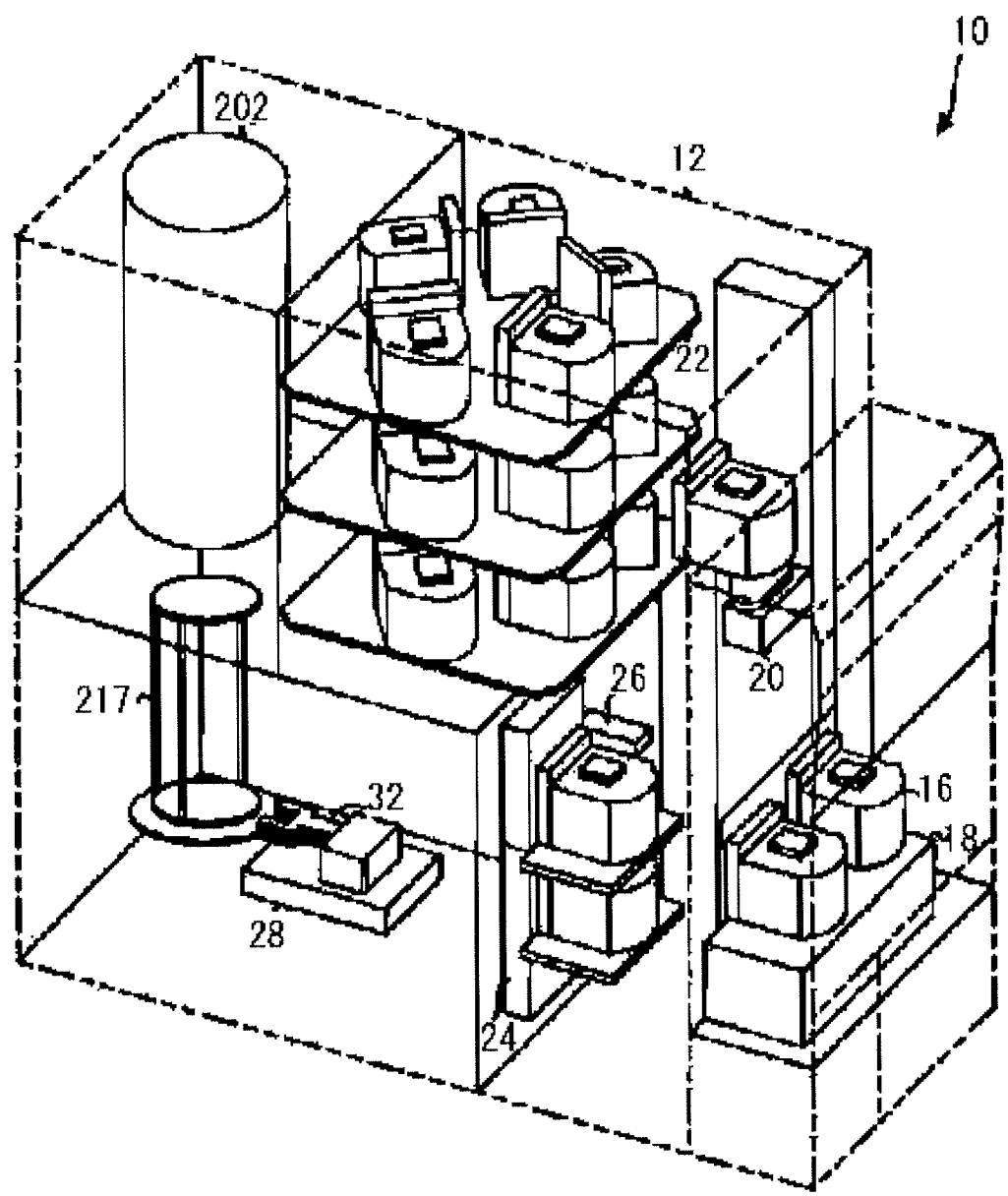
FIG. 1 is a perspective view of a semiconductor manufacturing apparatus according to a first embodiment of the present invention.

Hereinafter, the first embodiment of the present invention will be described in detail with reference to the appended drawings. FIG. 1 is a perspective view of a semiconductor manufacturing apparatus 10 as a substrate processing apparatus according to the first embodiment of the present invention. The semiconductor manufacturing apparatus 10 is a batch-type vertical heat treatment apparatus and includes a housing 12 in which main parts are disposed. In the semiconductor manufacturing device 10, a Front Opening Unified Pod (FOUP) (hereinafter referred to as a pod) 16 which is a substrate receiver that receives a wafer 200 as a substrate formed of, for example, silicon (Si) or silicon carbide (SiC) is used as a wafer carrier. A pod stage 18 is disposed in front of the housing 12, and the pod 16 is conveyed to the pod stage 18. For example, 25 sheets of wafers 200 are received in the pod 16, and the pod 16 is closed with a cover and then placed on the pod stage 18.

In the housing 12, a pod conveying device 20 is disposed at a front side of the housing 12 to face the pod stage 18. A pod shelf 22, a pod opener 24, and a substrate number detector 26 are disposed near the pod conveying device 20. The pod shelf 22 is disposed above the pod opener 24 and configured to hold a plurality of pods 16 while placing the plurality of pods 16. The substrate number detector 26 is disposed adjacent to the pod opener 24. The pod conveying device 20 conveys the pod 16 among the pod stage 18, the pod shelf 22, and the pod opener 24. The pod opener 24 opens the cover of the pod 16, and the substrate number detector 26 detects the number of the wafers 200 in the pod 16, the cover of which is open.

In the housing 12, a substrate transfer machine 28 and a boat 217 which is a substrate holder are disposed. The substrate transfer machine 28 may include an arm (tweezers) 32, and is configured to be vertically rotated by a driving unit (not shown). The arm 32 may be used to take out, for example, five sheets of wafers 200. By moving the arm 32, the wafers 200 are transferred between the pod 16 disposed on a location of the pod opener 24 and the boat 217.

Figure 2:
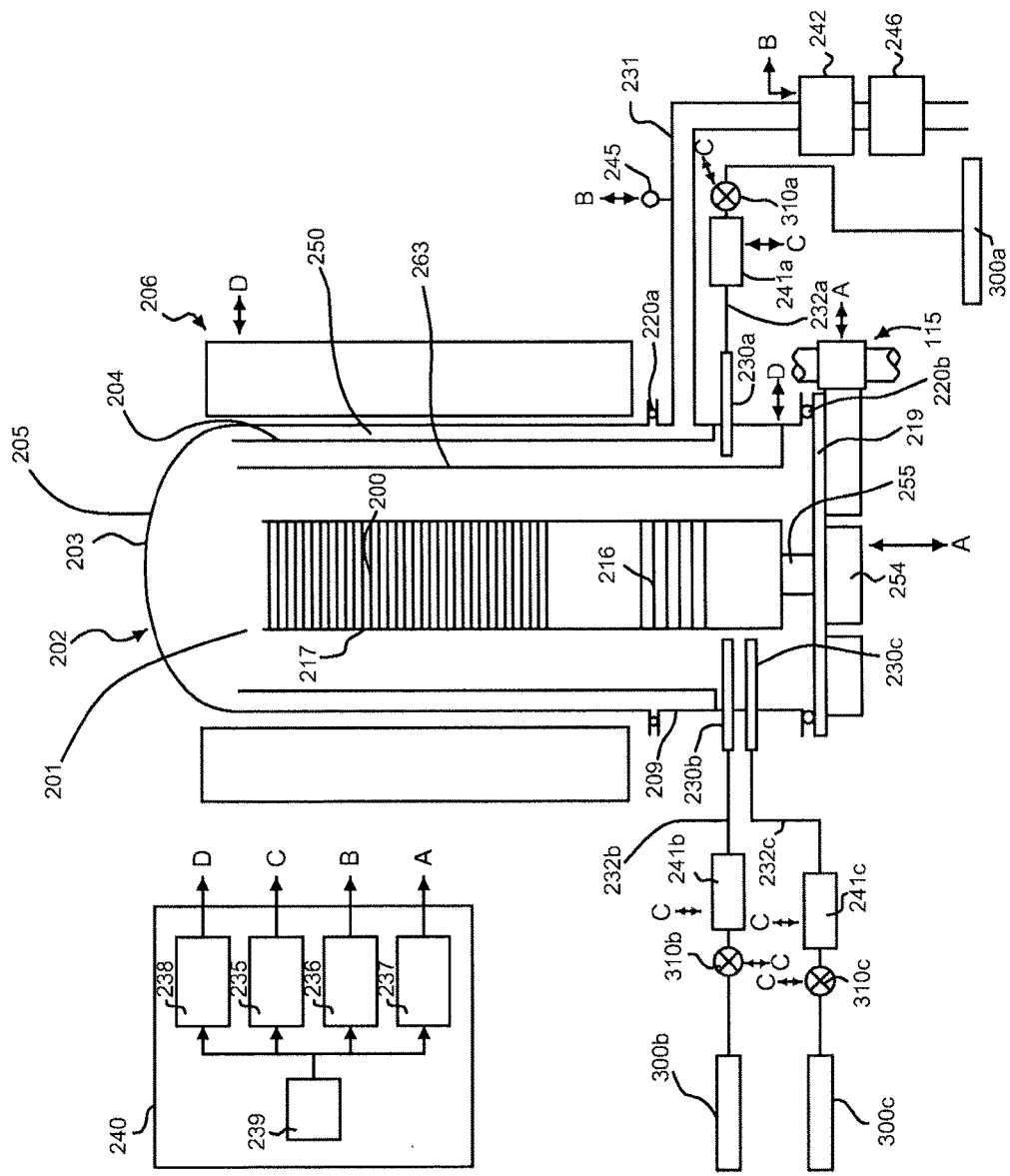
FIG. 2 shows a side cross-section of a structure of a processing furnace and each part of the substrate manufacturing apparatus according to the first embodiment of the present invention.
Figure 3:
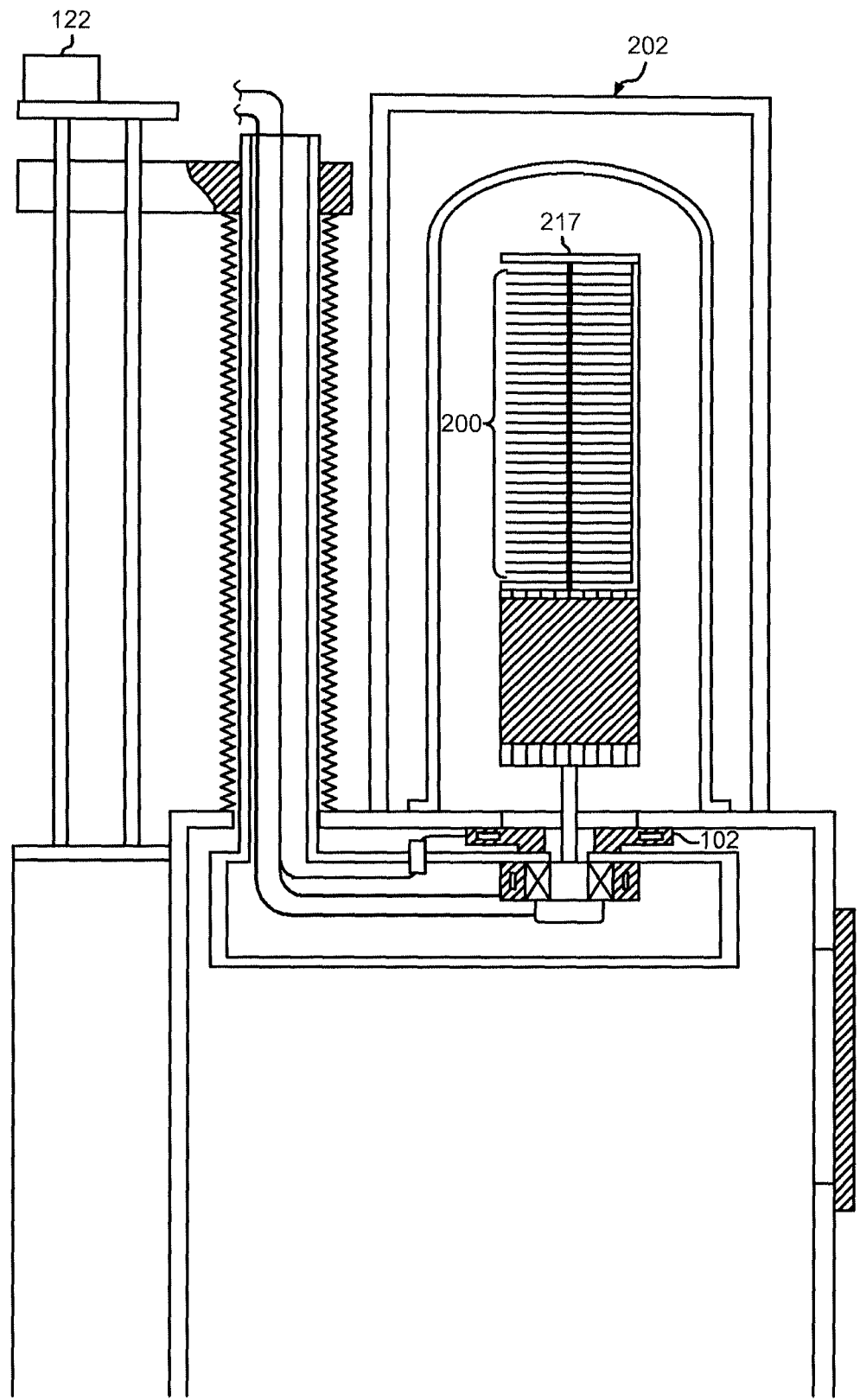
FIG. 3 is a schematic view of the processing furnace and peripheral structures of the substrate manufacturing apparatus according to the first embodiment of the present invention.

FIG. 2 is a schematic longitudinal cross-sectional view of a structure of a processing furnace 202 of a substrate processing apparatus according to an embodiment of the present invention.

As illustrated in FIG. 2, the processing furnace 202 includes a heater 206 as a heating device. The heater 206 has a tube shape, e.g., a cylindrical shape, and is vertically installed and supported by a heater base (not shown) which is a holding plate.

In the heater 206, a process tube 203 as a reaction tube having a concentric shape with the heater 206 is provided. The process tube 203 includes an inner tube 204 which is an internal reaction tube, and an outer tube 205 which is an external reaction tube installed at an outer side thereof. The inner tube 204 is formed of a heat-resistive material, e.g., quartz ($SiO_2$) or silicon carbide (SiC), and has a cylindrical shape having open upper and lower portions. A process chamber 201 is formed in a hollow portion of the inner tube 204. The process chamber 201 is configured to receive the wafers 200 as substrates, in a state in which the wafers 200 are arranged in a vertically multi-layered structure in a horizontal posture using the boat 217 which will be described in detail below. The outer tube 205 is formed of a heat-resistive material, e.g., quartz ($SiO_2$) or silicon carbide (SiC). The outer tube 205 has an internal diameter that is greater than an external diameter of the inner tube 204, has a cylindrical shape, an upper end of which is closed and a lower end of which is open, and has a concentric shape with the inner tube 204.

A manifold 209 is provided below the outer tube 205 to have a concentric shape with the outer tube 205. The manifold 209 is formed of, for example, stainless steel, and has a cylindrical shape, upper and lower ends of which are open. The manifold 209 is engaged with the inner tube 204 and the outer tube 205 to support the inner tube 204 and the outer tube 205. An O-ring 220a is installed as a sealing member between the manifold 209 and the outer tube 205. Since the manifold 209 is supported by the heater base (not shown), the process tube 203 is vertically maintained. A reaction container is formed mainly by the process tube 203 and the manifold 209.

In the manifold 209, nozzles 230a, 230b, and 230c which are gas injection ports are installed to communicate with the inside of the process chamber 201. Gas supply pipes 232a, 232b, and 232c are connected to the nozzles 230a, 230b, and 230c, respectively. A silicon-containing gas source 300a, a chlorine-containing gas source 300b, and an inert gas source 300c are connected to upstream sides of the gas supply pipes 232a, 232b, and 232c which are opposite to sides of the gas supply pipes 232a, 232b, and 232c connected to the nozzles 230a, 230b, and 230c via mass flow controllers (MFCs) 241a, 241b, and 241c which are gas flow rate controllers and valves 310a, 310b, and 310c which are switching devices. A gas flow rate control unit 235 is electrically connected to the MFCs 241a, 241b, and 241c so as to control a flow rate of gas to be supplied in a desired level at a desired timing.

The nozzle 230a that supplies a silicon-containing gas, e.g., disilane gas ($Si_2H_6$), is formed of, for example, a quartz material and is installed in the manifold 209 to pass through the manifold 209. At least one nozzle 230a is located below rather than the range which is opposite the heater 206, and is installed in the range which is opposite manifold 209, and may be configured to supply the silicon-containing gas into the process chamber 201. The nozzle 230a is connected to the gas supply pipe 232a. The gas supply pipe 232a is connected to the silicon-containing gas source 300a that supplies the silicon-containing gas, e.g., the disilane gas ($Si_2H_6$) via the MFC 241a as a flow rate controller (flow rate control member) and the valve 310a. Thus, the supply flow rate, concentration, and partial pressure of the silicon-containing gas, e.g., the disilane gas ($Si_2H_6$), which is supplied to the process chamber 201 may be controlled. A silicon-containing gas supply system provided as a gas supply system is mainly configured by the silicon-containing gas source 300a, the valve 310a, the MFC 241a, the gas supply pipe 232a, and the nozzle 230a.

The nozzle 230b that supplies a chlorine-containing gas, e.g., dichlorosilane gas ($SiH_2Cl_2$) is formed of, for example, a quartz material, and is installed in the manifold 209 to pass through the manifold 209. At least one nozzle 230b is located below rather than the range which is opposite the heater 206, and is installed in the range which is opposite manifold 209, and may be configured to supply the chlorine-containing gas into the process chamber 201. The nozzle 230b is connected to the gas supply pipe 232b. The gas supply pipe 232b is connected to the chlorine-containing gas source 300b that supplies the chlorine-containing gas, e.g., the dichlorosilane gas ($SiH_2Cl_2$) via the MFC 241b as a flow rate controller (flow rate control member) and the valve 310b. Thus, the supply flow rate, concentration, and partial pressure of the chlorine-containing gas, e.g., the dichlorosilane gas ($SiH_2Cl_2$), which is supplied into the process chamber 201 may be controlled. A chlorine-containing gas supply system provided as a gas supply system is mainly configured by the chlorine-containing gas source 300b, the valve 310b, the MFC 241b, the gas supply pipe 232b, and the nozzle 230b.

The nozzle 230c that supplies an inert gas, e.g., nitrogen gas ($N_2$), may be formed of, for example, a quartz material, and is formed in the manifold 209 to pass through the manifold 209. At least one nozzle 230c is located below rather than the range which is opposite the heater 206, and is installed in the range which is opposite manifold 209, and may be configured to supply the inert gas into the process chamber 201. The nozzle 230c is connected to the gas supply pipe 232c. The gas supply pipe 232c is connected to the inert gas source 300c that supplies the inert gas, e.g., the nitrogen gas ($N_2$) via the MFC 241c as a flow rate controller (flow rate control member) and the valve 310c. Thus, the supply flow rate, concentration, and partial pressure of the inert gas, e.g., the nitrogen gas ($N_2$), which is supplied to the process chamber 201 may be controlled. An inert gas supply system provided as a gas supply system is mainly configured by the inert gas source 300c, the valve 310c, the MFC 241c, the gas supply pipe 232c, and the nozzle 230c.

The gas flow rate control unit 235 is electrically connected to the valves 310a, 310b, and 310c and the MFCs 241a, 241b, and 241c so as to control a gas supply amount, start of the gas supply, and end of the gas supply at desired timings.

Although, in the present embodiment, the nozzles 230a, 230b, and 230c are installed in the range which is opposite 209, the present invention is not limited thereto. For example, at least some of the nozzles 230a, 230b, and 230c may located below rather than the range which is opposite the heater 206 so as to supply the silicon-containing gas, the chlorine-containing gas, or the inert gas to a process region of a wafer. For example, at least one L-shaped nozzle may be used, and a location at which gas is supplied may extend to the process region of the wafer in order to supply gas from at least one location to a region near the wafer. Furthermore, the nozzles 230a, 230b, and 230c may be installed in a region facing either the manifold 209 or the heater 206.

Also, although, in the present embodiment, the disilane gas ($Si_2H_6$) is used as the silicon-containing gas, the present invention is not limited thereto and a high-order silane gas, e.g., silane gas ($SiH_4$) or trisilane gas ($Si_3H_8$), or a combination of such high-degree silane gases may be used.

Also, although, in the present embodiment, the dichlorosilane gas ($SiH_2Cl_2$) is used as the chlorine-containing gas, the present invention is not limited thereto. For example, a chloro silane-based gas, e.g., trichlorosilane gas ($SiHCl_3$) or tetrachloro-silane gas ($SiCl_4$), chlorine gas ($Cl_2$) or hydrogen chloride gas (HCl), or a combination thereof may be used.

Also, although, in the present embodiment, nitrogen gas ($N_2$) is used as the inert gas, the present invention is not limited thereto. For example, a rare gas, e.g., helium gas (He), neon gas (Ne), or argon gas (Ar), may be used or a combination of nitrogen gas ($N_2$) and a rare gas may be used.

In the manifold 209, an exhaust pipe 231 is installed to exhaust an atmosphere in the process chamber 201. The exhaust pipe 231 is disposed at a lower end portion of a tube-shaped space 250 formed by a gap between the inner tube 204 and the outer tube 205, and connects to the tube-shaped space 250. A vacuum exhaust device 246, e.g., a vacuum pump, is connected to a downstream side of the exhaust pipe 231 which is opposite to a side of the exhaust pipe 231 connected to the manifold 209 via a pressure sensor 245 which senses pressure and a pressure control device 242. The vacuum exhaust device 246 is configured to perform vacuum-exhaust in such a manner that pressure in the process chamber 201 may be equal to a predetermined pressure (predetermined degree of vacuum). The pressure control device 242 and the pressure sensor 245 are electrically connected to a pressure control unit 236. The pressure control unit 236 is configured to control the pressure control device 242, based on pressure sensed by the pressure sensor 245 at a desired timing so that the pressure in the process chamber 201 may be equal to a desired pressure.

A seal cap 219 is installed below the manifold 209 and functions as a furnace port lid configured to air-tightly close a lower end opening of the manifold 209. The seal cap 219 is configured to abut a lower end of the manifold 209 from a lower side in a vertical direction. The seal cap 219 is formed of, for example, stainless steel, and has a disc shape. An O-ring 220b which is a seal member that abuts a lower end of the manifold 209 is disposed on an upper surface of the seal cap 219. At a side of the seal cap 219 opposite to the process chamber 201, a rotation mechanism 254 is installed to rotate the boat 217. A rotation shaft 255 of the rotation mechanism 254 passes through the seal cap 219 to be connected to the boat 217 which will be described in detail below. The rotation mechanism 254 is configured to rotate the wafers 200 by rotating the boat 217. The seal cap 219 is configured to be vertically moved by a boat elevator 115 which is an elevating mechanism vertically installed outside the process tube 203. By vertically moving the seal cap 219, the boat 217 may be loaded into or unloaded from the process chamber 201. The rotation mechanism 254 and the boat elevator 115 are electrically connected to a driving control unit 237 so as to be controlled to perform a desired operation at a desired timing.

The boat 217 which is a substrate holder is formed of a heat-resistive material, e.g., quartz or silicon carbide, and is configured to hold a plurality of sheets of wafers 200 in the form of a multi-layer structure by arranging the plurality of sheets of wafers 200 horizontally and concentrically. A plurality of sheets of insulating plates 216 formed of a heat-resistive material, e.g., quartz or silicon carbide, and having disc shapes are each horizontally placed below the boat 217 to form a multi-layer structure. Thus, heat generated from the heater 206 may be prevented from being delivered to the manifold 209.

In the process tube 203, a temperature sensor 263 is installed to sense temperature. A temperature control unit 238 is electrically connected to the heater 206 and the temperature sensor 263 so as to control the process chamber 201 to have a desired temperature distribution at a desired timing by controlling supply of current to the heater 206, based on temperature information sensed by the temperature sensor 263.

The gas flow rate control unit 235, the pressure control unit 236, the driving control unit 237, and the temperature control unit 238 form a manipulation unit and an input/output (I/O) unit, and are electrically connected to a main control unit 239 that controls overall operations of the substrate processing apparatus. The gas flow rate control unit 235, the pressure control unit 236, the driving control unit 237, the temperature control unit 238, and the main control unit 239 form a controller 240.

Next, a method of forming a silicon film on a wafer 200 by chemical vapor deposition (CVD) using the processing furnace 202 described above, which is a process included in a method of manufacturing a semiconductor device, will be described below. In the description below, operations of the elements of the substrate processing apparatus are controlled by the controller 240.

When several sheets of wafers 200 are loaded into the boat 217 (wafer charging), the boat 217 holding the several sheets of wafers 200 is lifted by the boat elevator 115 to be loaded into the process chamber 201 (boat loading) as illustrated in FIG. 2. In this state, the seal cap 219 seals the lower end of the manifold 209 via the O-ring 220b.

The inside of the process chamber 201 is vacuum-exhausted to a desired degree of pressure (degree of vacuum) by the vacuum exhaust device 246. In this case, pressure in the process chamber 201 is measured by the pressure sensor 245, and is feedback-controlled by the pressure control device 242, based on the measured pressure. The process chamber 201 is heated by the heater 206 so that the inside of the process chamber 201 has a desired temperature. In this case, a flow of current supplied to the heater 206 is feedback-controlled based on the temperature information sensed by the temperature sensor 263, so that the inside of the process chamber 201 may have a desired temperature distribution. Then, the wafers 200 are rotated by rotating the boat 217 by the rotation mechanism 254.

Then, as illustrated in FIG. 2, for example, a silicon-containing gas is supplied as process gas from the silicon-containing gas source 300a. The silicon-containing gas, the flow rate of which is controlled to a desired level by the MFC 241a is introduced into the process chamber 201 through the gas supply pipe 232a and the nozzle 230a. Then, the introduced silicon-containing gas moves upward in the process chamber 201, is discharged into the cylindrical space 250 through an upper end opening of the inner tube 204, and is then exhausted via the exhaust pipe 231. The silicon-containing gas contacts the surface of the wafer 200 when the silicon-containing gas passes through the process chamber 201. In this case, a film, e.g., a silicon film, is deposited on the wafers 200 by a thermal CVD reaction.

After a predetermined time has elapsed, an inert gas, the flow rate of which is controlled to a desired level by the MFC 241c, is supplied from the inert gas source 300c to replace the atmosphere in the process chamber 201 with the inert gas, thereby allowing the pressure in the process chamber 201 to return to a normal pressure.

Then, the seal cap 219 is moved downward by the boat elevator 115 to open the lower end of the manifold 209, and the processed wafer 200 is unloaded from the lower end of the manifold 209 to the outside of the process tube 203 while being held by the boat 217 (boat unloading). Then, the processed wafer 200 is discharged from the boat 217 (wafer discharging).

Next, a method of forming a film according to the first embodiment of the present invention will be described in greater detail. By using the semiconductor manufacturing apparatus 10 described above, a desired film is formed on a substrate as described below according to a process included in a method of manufacturing a semiconductor device.

FIGS. 4A to 4D are diagrams illustrating a state of a substrate according to each process in the first embodiment of the present invention. As illustrated in FIGS. 4A to 4D, according to the first embodiment of the present invention, a chlorine-containing gas and a silicon-containing gas are supplied onto a wafer 200 which is a substrate to form a silicon film having a predetermined thickness thereon. Thus, the silicon film having the predetermined thickness may be formed by controlling a thickness distribution in a plane of the silicon film formed on the wafer 200, as will be described in detail below.

First, each process will be described in detail below.
<Nucleus Growth Suppression Process>

Figure 4A:
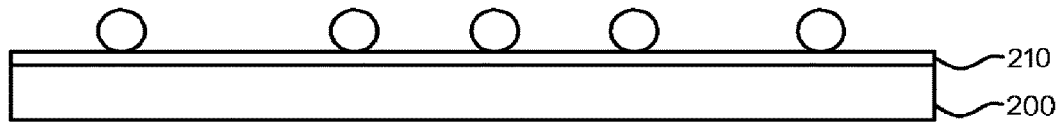
FIGS. 4A to 4D are schematic views illustrating a state of a substrate according to each process in the first embodiment of the present invention.
Figure 4B:
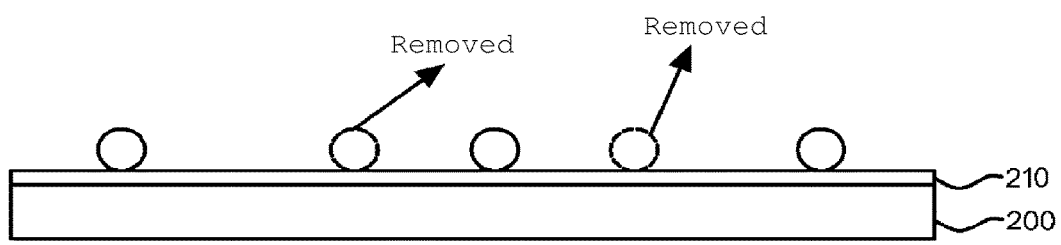

This process is performed to suppress local growth of nuclei (impurities generated on a substrate in an initial stage, formed silicon nuclei, etc.) by partially removing the nuclei or suppressing the growth of the nuclei. As described above, while silicon nuclei are formed on the wafer 200, the growth of the silicon nuclei is suppressed by supplying the chlorine-containing gas for a predetermined time, suppressing the growth of the formed silicon nuclei illustrated in FIG. 4A and separating some silicon nuclei from the wafer 200, as illustrated in FIG. 4B.

Although, in the present embodiment, dichlorosilane ($SiH_2Cl_2$) gas is used as the chlorine-containing gas, the present invention is not limited thereto. For example, trichlorosilane gas ($SiHCl_3$), tetrachlorosilane gas ($SiCl_4$), chlorine gas ($Cl_2$), hydrogen chloride gas (HCl), or a combination thereof may be used.

As an example, in the present embodiment, conditions of processing the wafer 200 in the process chamber 201, i.e., conditions of suppressing the growth of the silicon nuclei on the wafer 200 using the dichlorosilane ($SiH_2Cl_2$) gas, may include the following:

Process temperature: equal to or greater than 300° C. and is less than or equal to 500° C., Process pressure: equal to or greater than 10 Pa and is less than or equal to 1,330 Pa, and Supply flow rate of the dichlorosilane ($SiH_2Cl_2$) gas: equal to or greater than 10 sccm and is less than or equal to 5,000 sccm, By maintaining the above conditions to fall constantly within the ranges described above, the growth of the silicon nuclei on the wafer 200 may be suppressed.
<Nucleus Formation Process>

This operation is performed to form silicon nuclei on the wafer 200 which is the substrate. The silicon nuclei can be formed on the entire wafer 200 by repeatedly performing one cycle including the nucleus growth suppression process and the nucleus formation process twice or more. A process of forming a film, e.g., an amorphous silicon film, on the wafer 200 formed of silicon will now be described. As illustrated in FIG. 4A, at least silicon-containing gas is supplied into the process chamber 201 for a predetermined time so as to form silicon nuclei on the wafer 200.

Silane gas ($SiH_4$), disilane gas ($Si_2H_6$), or a combination thereof may be used as the silicon-containing gas.

As an example, in the present embodiment, conditions of processing the wafer 200 in the process chamber 201, i.e., conditions of forming the silicon nuclei on the wafer 200 using the disilane gas ($Si_2H_6$), may include the following:

Process temperature: equal to or greater than 300° C. and is less than or equal to 500° C., Process pressure: equal to or greater than 10 Pa and is less than or equal to 1,330 Pa, and Supply flow rate of the disilane gas ($Si_2H_6$): equal to or greater than 10 sccm and is less than or equal to 5,000 sccm By maintaining the above conditions to fall constantly within the ranges described above, the silicon nuclei may be formed on the wafer 200.

Figure 4C:
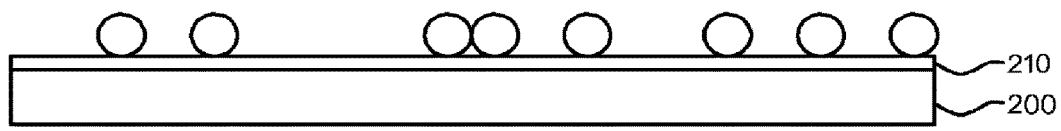
Figure 4D:
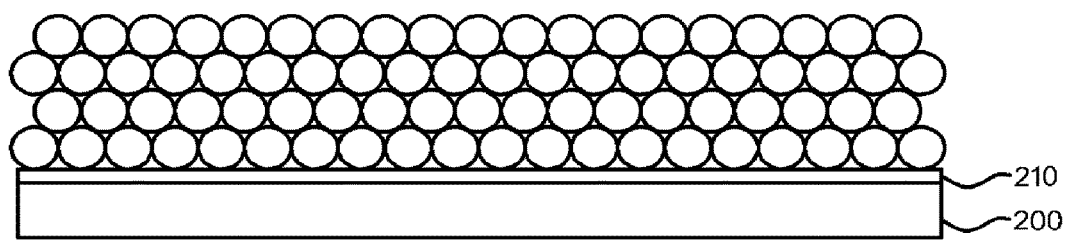

After the nucleus growth suppression process is performed, the nucleus formation process is performed to form the silicon nuclei on the wafer 200, thereby forming new silicon nuclei as illustrated in FIG. 4C. By repeatedly performing one cycle including the nucleus growth suppression process (see FIG. 4B) and the nucleus formation process (see FIG. 4C) twice or more, silicon nuclei are evenly formed on the wafer 200 as illustrated in FIG. 4D. Then, a silicon film is formed on the wafer 200 by growing the formed silicon nuclei.

Here, a mechanism of controlling the growth of the silicon nuclei will be described.

The silicon nuclei formed on the wafer 200 may be coarsened to grow as the silicon film by further supplying the silicon-containing gas. However, when the silicon nuclei are coarsened to grow as the silicon film, although the growth of the formed silicon nuclei is promoted, silicon nuclei are formed late on portions of the wafer 200 at which no silicon nuclei are present. Thus, the sizes of the silicon nuclei formed on the wafer 200 may not be the same. In this case, the silicon film formed on the wafer 200 has an uneven thickness distribution.

Accordingly, according to the present embodiment, as described above, first, the silicon-containing gas is first supplied once for a predetermined time, and then, the chlorine-containing gas is supplied to delay the coarsening of the silicon nuclei formed on the wafer 200 when the silicon-containing gas was supplied once. Then, the silicon-containing gas is supplied for a predetermined time so as to form silicon nuclei on portions of the wafer 200 on which no silicon nuclei were formed when the silicon-containing gas was first supplied. That is, the sizes of silicon nuclei can be uniformized by forming new silicon nuclei while suppressing the growth of silicon nuclei that are first formed.

As described above, silicon nucleus growth suppression and silicon nucleus formation may be repeatedly performed to evenly form silicon nuclei on the wafer 200. Also, the thickness distribution of the formed silicon film on the wafer 200 may be improved by controlling the growth of the evenly formed silicon nuclei.

An oxide silicon film may be formed on the wafer 200, and an amorphous silicon film may be formed on the oxide silicon film as described above. Thus, since an adhesive strength between the amorphous silicon film and the oxide silicon film is high, it is possible to prevent the performance of a semiconductor device from being degraded and the throughput from being lowered.

Also, preprocessing may be performed before the nucleus formation process is performed. Thus, impurities adhered onto the wafer 200 may be removed to form the silicon film without causing the growth of the silicon nuclei to be interfered with by the impurities.

Also, the atmosphere in a reaction furnace may be replaced with vacuum or nitrogen gas ($N_2$) by supplying the nitrogen gas between the nucleus growth suppression process and the nucleus formation process. Thus, it is possible to efficiently react gases supplied during the processes.

Although formation of a film by CVD has been described above, the present invention is not limited thereto, and for example, atomic layer deposition (ALD) may be used.

After a series of processes are completed, the supply of such process gases is suspended, and inert gas is supplied from an inert gas source to replace the atmosphere in the process chamber 201 with the inert gas, thereby returning the pressure in the process chamber 201 to a normal pressure.

Then, the seal cap 219 is moved downward by a lifting motor 122 to open the lower end of the manifold 209, the boat 217 holding the processed wafer 200 is unloaded from the lower end of the manifold 209 to the outside of the process chamber 201 (boat unloading), and the boat 217 stands by at a predetermined location until all wafers 200 supported in the boat 217 are cooled. When the stand-by wafers 200 in the boat 217 are cooled to a predetermined temperature, the wafers 200 are unloaded from the boat 218 by the substrate transfer unit 28, and transferred to and received in the pod 16 that is unoccupied and set in the pod opener 24. Then, the pod 16 receiving the wafers 200 is transferred to the pod shelf 22 or the pod stage 18 by the pod conveying device 20, thereby completing the operations of the semiconductor manufacture apparatus 10.

Figure 5:
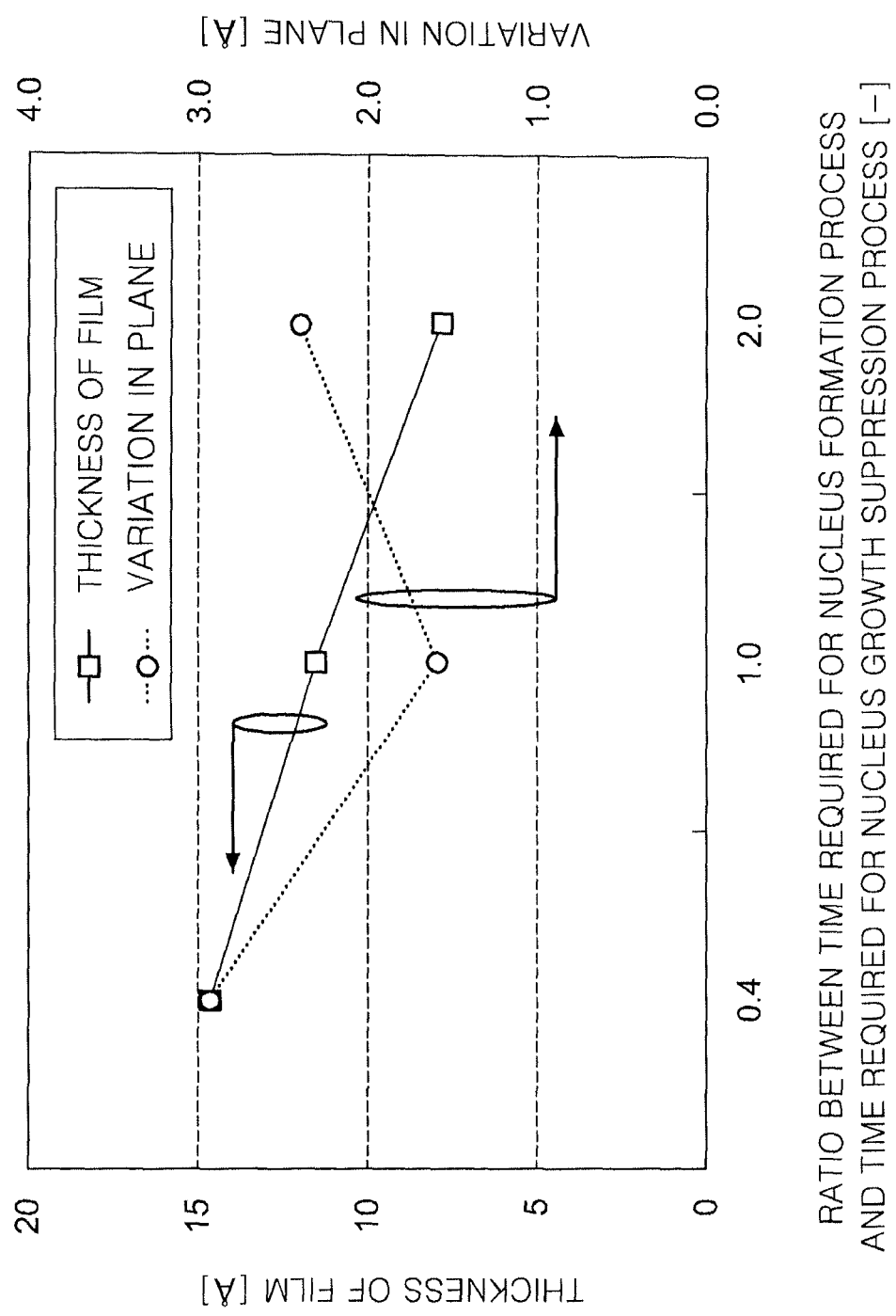
FIG. 5 is a graph showing a result of forming a silicon film according to the first embodiment of the present invention.

A result of forming a film as described above will now be described. FIG. 5 is a graph showing a result of forming a silicon film as described above. Sample data in the graph of FIG. 5 shows results when a time required to form nuclei was X [sec.] and when times required to suppress the growth of the nuclei were 0.4X, X, and 2X [sec.]. In the graph of FIG. 5, the right vertical axis denotes a thickness [Å] of a silicon film formed on a wafer according to each of conditions, the left vertical axis denotes a variation in thickness distribution [Å] of the silicon film on the wafer, and the horizontal axis denotes a ratio [-] between a time required for nucleus formation suppression and a time required for nucleus formation. The variation in the thickness distribution [Å] denotes the difference between a maximum thickness and a minimum thickness of the silicon film on the wafer. When the variation in the thickness distribution [Å] is small, it means that the formed silicon film is evenly formed on the wafer.

Referring to FIG. 5, as a time required to perform nucleus growth suppression was relatively longer than a time required to perform nucleus formation, i.e., as the ratio [-] between the time required for nucleus formation suppression and the time required for nucleus formation approached zero, the speed of forming a film gradually decreased. Also, as the time required to perform nucleus growth suppression became longer than that required to perform nucleus formation (when the ratio [-] between the time required for nucleus formation suppression and the time required for nucleus formation exceeded '1.0'), the variation in the thickness distribution [Å] gradually increased. Thus, if this ratio [-] is equal to or greater than '0.4' and is less than or equal to '1', a silicon film having a less variation in the thickness distribution [Å] may be formed.

According to the present embodiment, at least one or more of the following advantages may be achieved:

(1) A silicon film having an improved thickness distribution can be formed.

(2) An insulating film of silicon can be evenly formed, particularly, when (1) is applied to a semiconductor manufacture process.

(3) In relation to (1), a time required for nucleus growth suppression may be between 0.4 and 1 times a time required for nucleus formation.

(4) Good step coverage can be achieved particularly when (1) is applied to a trench structure having a high aspect ratio or the like.

(5) A semiconductor device having high performance can be stably manufactured, thereby improving the throughput.

[Second Embodiment]

Next, a second embodiment of the present invention will be described. The second embodiment is a modified example of the first embodiment of the present invention, in which nucleus formation is performed to form a film after repeatedly performing one cycle including a nucleus growth suppression process and a nucleus formation process twice or more, as will be described in detail below.

Each of the processes will now be described in detail.

<Nucleus Growth Suppression Process>

As described above, while silicon nuclei are formed on the wafer 200, the growth of the formed silicon nuclei is controlled by supplying a chlorine-containing gas for a predetermined time.

Although, in the present embodiment, dichlorosilane gas ($SiH_2Cl_2$) is used as the chlorine-containing gas, the present invention is not limited thereto. For example, trichlorosilane gas ($SiHCl_3$), tetrachiorosilane gas ($SiCl_4$), chlorine gas ($Cl_2$), hydrogen chloride gas (HCl), or a combination thereof may be used.

As an example, in the present embodiment, conditions of processing the wafer 200 in the process chamber 201, i.e., conditions of suppressing the growth of the silicon nuclei on the wafer 200 using the dichlorosilane gas ($SiH_2Cl_2$), may include the following:

Process temperature: equal to or greater than 300° C. and is less than or equal to 500° C., Process pressure: equal to or greater than 10 Pa and is less than or equal to 1,330 Pa, and Supply flow rate of the dichlorosilane gas ($SiH_2Cl_2$): equal to or greater than 10 sccm and is less than or equal to 5,000 sccm By maintaining the above conditions to fall constantly within the ranges described above, the growth of the silicon nuclei on the wafer 200 may be suppressed.

<Nucleus Formation Process>

A process of forming a film, e.g., an amorphous silicon film, on the wafer 200 which is a substrate formed of silicon will now be described. In this process, silicon nuclei are formed on the wafer 200 by supplying at least silicon-containing gas into the process chamber 201.

Silane gas ($SiH_4$), disilane gas ($Si_2H_6$), or a combination thereof may be used as the silicon-containing gas.

As an example, in the present embodiment, conditions of processing the wafer 200 in the process chamber 201, i.e., conditions of forming silicon nuclei on the wafer 200 using the disilane gas ($Si_2H_6$), may include the following:

Process temperature: equal to or greater than 300° C. and is less than or equal to 500° C., Process pressure: equal to or greater than 10 Pa and is less than or equal to 1,330 Pa, and Supply flow rate of the disilane gas ($Si_2H_6$): equal to or greater than 10 sccm and is less than or equal to 5,000 sccm By maintaining the above conditions to fall constantly within the ranges described above, the silicon nuclei may be formed on the wafer 200.

<Nucleus Growth Process>

This process is performed to grow the silicon nuclei formed on the entire wafer 200 after one cycle including the nucleus growth suppression process and the nucleus formation process is performed twice or more. As described above, while the silicon nuclei are evenly formed on the wafer 200, a silicon film is formed by supplying a silicon-containing gas for a predetermined time to grow the formed silicon nuclei.

Silane gas ($SiH_4$), disilane gas ($Si_2H_6$), or a combination thereof may be used as the silicon-containing gas.

As an example, in the present embodiment, conditions of processing the wafer 200 in the process chamber 201, i.e., conditions of controlling the growth of the silicon nuclei on the wafer 200 by using the silane gas ($SiH_4$), may include the following:

Process temperature: equal to or greater than 300° C. and is less than or equal to 500° C., Process pressure: equal to or greater than 10 Pa and is less than or equal to 1,330 Pa, and Supply flow rate of the silane gas ($SiH_4$): equal to or greater than 10 sccm and is less than or equal to 5,000 sccm By maintaining the above conditions to fall constantly within the ranges described above, the silicon nuclei formed on the wafer 200 may be grown to become a silicon film.

Accordingly, the silicon film may be formed by efficiently growing the silicon nuclei evenly formed on the wafer 200.

According to the present embodiment, at least one of the following advantages may be further achieved, in addition to the advantages that may be achieved according to the first embodiment.

(1) A silicon film can be formed by efficiently growing the silicon nuclei.

(2) In relation to (1), consumption of a source gas can be reduced.

The present invention may be applied not only to batch-type apparatuses but also to single-type apparatuses.

Also, the preset invention has been described above with respect to formation of a polysilicon film, but may also be applied to formation of an epitaxial film or a CVD film, e.g., a silicon nitride film.

According to the present invention, degradation in the quality of a substrate or the performance of a semiconductor device can be prevented.

What is claimed is:

1. A method of manufacturing a semiconductor device, comprising:
   (a) forming silicon nuclei on an entire surface of a substrate to cover the entire surface without a gap between the formed silicon nuclei and the substrate by alternately repeating a cycle twice or more, the cycle including:
      (a-1) supplying a first silicon-containing gas containing chlorine to the substrate under a condition that the silicon nuclei present on a surface of the substrate is partially removed and a growth of the silicon nuclei remaining on the surface of the substrate is suppressed and exhausting the supplied first silicon-containing gas containing chlorine; and
      (a-2) directly after the step (a-1), supplying a second silicon-containing gas different from the supplied first silicon-containing gas containing chlorine to the substrate under a condition that the silicon nuclei is formed on a portion of the surface of the substrate where the silicon nuclei is not present and exhausting the supplied second silicon-containing gas; and
   (b) forming a silicon film by supplying a third silicon-containing gas different from the supplied first silicon-containing gas containing chlorine to the substrate to grow the silicon nuclei formed in the step (a) and exhausting the supplied third silicon-containing gas.

2. The method of claim 1, wherein the silicon film comprises an amorphous silicon film.

3. The method of claim 1, wherein the supplied third silicon-containing gas differs from the supplied second silicon-containing gas.

4. The method of claim 1, wherein the supplied third silicon-containing gas is same as the supplied second silicon-containing gas.

5. The method of claim 1, wherein the supplied first silicon-containing gas containing chlorine comprises at least one selected from the group consisting of $SiH_2Cl_2$ gas, $SiHCl_3$ gas and $SiCl_4$ gas, the supplied second silicon-containing gas comprises at least one selected from the group consisting of $Si_2H_6$ gas, $SiH_4$ gas and $Si_3H_8$ gas, and the supplied third silicon-containing gas comprises at least one selected from the group consisting of $Si_2H_6$ gas and $SiH_4$ gas.

6. The method of claim 1, wherein the supplied first silicon-containing gas containing chlorine comprises $SiH_2Cl_2$ gas, the supplied second silicon-containing gas comprises $Si_2H_6$ gas or $SiH_4$ gas, and the supplied third silicon-containing gas comprises $Si_2H_6$ gas or $SiH_4$ gas.

7. The method of claim 1, wherein the supplied first silicon-containing gas containing chlorine comprises $SiH_2Cl_2$ gas, the supplied second silicon-containing gas comprises $Si_2H_6$ gas, and the supplied third silicon-containing gas comprises $SiH_4$ gas.

8. The method of claim 1, wherein a time required for the step (a-1) is less than or equal to a time required for the step (a-2).

9. The method of claim 1, wherein each of the steps (a-1) and (a-2) is performed at a temperature equal to or higher than 300° C. and equal to or lower than 500° C.

10. The method of claim 9, wherein each of the steps (a-1) and (a-2) is performed under a processing pressure equal to or higher than 10 Pa and equal to or lower than 1,330 Pa.

11. The method of claim 1, wherein the silicon nuclei is continuously formed on the entire surface of the substrate in the step (a).

12. A substrate processing method comprising:
(a) forming silicon nuclei on an entire surface of a substrate to cover the entire surface without a gap between the formed silicon nuclei and the substrate by alternately repeating a cycle twice or more, the cycle including:
   (a-1) supplying a first silicon-containing gas containing chlorine to the substrate to partially remove the silicon nuclei and impurities present on the surface of the substrate and suppress a growth of the silicon nuclei remaining on the surface of the substrate and exhausting the supplied first silicon-containing gas containing chlorine; and
   (a-2) directly after the step (a-1), supplying a second silicon-containing gas different from the supplied first silicon-containing gas containing chlorine to the substrate to form the silicon nuclei on a portion of the surface of the substrate where the silicon nuclei is not present and exhausting the supplied second silicon-containing gas; and
(b) forming a silicon film by supplying a third silicon-containing gas different from the supplied first silicon-containing gas containing chlorine to the substrate to grow the silicon nuclei formed in the step (a) and exhausting the supplied third silicon-containing gas.

13. A substrate processing apparatus comprising:
a process chamber configured to accommodate a substrate;
a first gas supply system configured to supply a first silicon-containing gas containing chlorine to the substrate in the process chamber;
a second gas supply system configured to supply a second silicon-containing gas different from the supplied first silicon-containing gas containing chlorine to the substrate in the process chamber;
a third gas supply system configured to supply a third silicon-containing gas different from the supplied first silicon-containing gas containing chlorine to the substrate in the process chamber;
an exhaust system configured to exhaust the gases supplied to the substrate; and
a controller configured to control the first gas supply system, the second gas supply system, the third gas supply system and the exhaust system by the controller being configured to perform:
(a) forming silicon nuclei on an entire surface of the substrate to cover the entire surface without a gap between the formed silicon nuclei and the substrate by alternately repeating a cycle twice or more, the cycle including:
   (a-1) supplying the supplied first silicon-containing gas containing chlorine to the substrate in the process chamber under a condition that the silicon nuclei present on the surface of the substrate is partially removed and a growth of the silicon nuclei remaining on the surface of the substrate is suppressed and exhausting the supplied first silicon-containing gas containing chlorine; and
   (a-2) directly after the act (a-1), supplying the supplied second silicon-containing gas to the substrate in the process chamber under a condition that the silicon nuclei is formed on a portion of the surface of the substrate where the silicon nuclei is not present and exhausting the supplied second silicon-containing gas; and
(b) forming a silicon film by supplying the supplied third silicon-containing gas to the substrate in the process chamber to grow the silicon nuclei formed in the act (a) and exhausting the supplied third silicon-containing gas.

* * * * *